United States Patent [19]

Hynecek

[11] Patent Number: 4,708,766
[45] Date of Patent: Nov. 24, 1987

[54] HYDROGEN IODIDE ETCH OF TIN OXIDE

[75] Inventor: Jaroslav Hynecek, Richardson, Tex.

[73] Assignee: Texas Instruments Incorporated, Dallas, Tex.

[21] Appl. No.: 928,341

[22] Filed: Nov. 7, 1986

[51] Int. Cl.$^4$ .......................... C23F 1/02; B44C 1/22; C03C 15/00; C03C 25/06
[52] U.S. Cl. .................................. 156/643; 156/646; 156/653; 156/655; 156/659.1; 156/662; 156/667; 156/345; 204/192.32; 204/298; 252/79.1
[58] Field of Search ............... 156/643, 646, 653, 655, 156/659.1, 662, 667, 345; 252/79.1; 204/192.32, 298

[56] References Cited

U.S. PATENT DOCUMENTS

| | | | |
|---|---|---|---|
| 3,095,341 | 6/1963 | Ligenza | 156/646 |
| 3,366,520 | 1/1968 | Berkenblit et al. | 156/646 |
| 3,757,733 | 9/1973 | Reinberg | 118/49.5 |
| 4,140,814 | 2/1979 | Hynecek | 427/39 |
| 4,280,141 | 7/1981 | McCann et al. | 358/213 |
| 4,292,384 | 9/1981 | Straughan et al. | 156/643 X |
| 4,336,295 | 6/1982 | Smith | 156/667 X |
| 4,544,444 | 10/1985 | Chang | 156/667 X |

OTHER PUBLICATIONS

McCann et al., "Buried-Channel CCD Imaging Arrays with Tin-Oxide Transparent Gates", 1978 IEEE International Solid-State Circuit Conference, Digest of Technical Papers, pp. 30–31.
Brown et al., "Transparent Metal Oxide Electrode CID Imager Array", 1975 IEEE International Solid-State Circuit Conference, Digest of Technical Pages, pp. 34–35.
Brown et al., "Transparent Metal Oxide Electrode CID Imager", IEEE Journal of Solid-State Circuits, vol. SC-11, No. 1, Feb. 1976, pp. 128–132.
Mammana et al., "Plasma Etching of SnO$_2$ Films on Silicon Substrates", Elsevier Sequoia S.A., Lausanne, printed in the Netherlands, pp. L5–L6.
Baliga et al., "Electrochemical Patterning of Tin Oxide Films", Electrochemical Science and Technology, Jul. 1977, vol. 124, No. 7, pp. 1059–1060.
Bradshaw et al., "Etching Methods for Indium Oxide/Tin Oxide Films", Elsevier Sequoia S.A., Lausanne, printed in Switzerland, pp. L5–L6.
Keenan et al., "A Tin Oxide Transparent-Gate Buried-Channel Virtual-Phase CCD Imager", IEEE Transactions on Electron Devices, vol. Ed 32, No. 8, Aug. 1985, pp. 1531–1533.

Primary Examiner—William A. Powell
Attorney, Agent, or Firm—Carlton H. Hoel; Leo N. Heiting; Melvin Sharp

[57] ABSTRACT

Disclosed is a method for etching a tin oxide layer (18). The tin oxide layer (18) is masked by selectively forming an etchant-resistant material (20) on it. This material is itself patterned and etched, and then the exposed tin oxide (26) is isotropically etched such that substantially all of the exposed tin oxide (26) is removed. The preferred etchant of the invention comprises a major portion of inert nitrogen gas with a minor portion of hydrogen iodide. A vertical wall reactor (48) is provided for use with the invention in order to achieve a uniform flow and etch rate. In an alternate embodiment, a plasma reactor can be used to perform the etching.

26 Claims, 6 Drawing Figures

HYDROGEN IODIDE ETCH OF TIN OXIDE

TECHNICAL FIELD OF THE INVENTION

This invention relates in general to methods and apparatus for fabricating integrated circuits incorporating tin oxide and relates more particularly to a method and apparatus for etching tin oxide.

BACKGROUND OF THE INVENTION

Tin oxide finds use in the semiconductor field because of its transparent and semiconductive properties. For instance, it is superior to polysilicon or other conductors for applications such as CCD imager electrodes because of its transparency.

Tin oxide however has a disadvantage in that it is extremely refractory in nature, and is highly resistant or impervious to most etchant materials. As disclosed in German Pat. No. 2,425,702, it is possible to etch tin oxide using a hydrogen iodide 45% to 51% aqueous solution if the solution is heated to approximately 90° C. This method has been applied to semiconductor structures, but the results have been unsatisfactory. When etched by this wet etch, layers of tin oxide showed cracking and a differential attack along the grain boundaries of the tin oxide film. As will be explained below, other gas etchants have been found to be anisotropic, that is, they do not etch tin oxide at an equal rate in all directions. In cases of complex surface topography, this has led to undesirable tin oxide remnants that in turn cause shorts between circuit components.

There therefore exists a need in the industry to provide a method and apparatus for isotropically etching tin oxide on CCD imagers and other integrated circuits where high pattern resolution is necessary.

SUMMARY OF THE INVENTION

Preferred embodiments of the invention include a method for etching a tin oxide layer as deposited on a surface, such as an oxide or semiconductor surface, of an integrated circuit chip. The tin oxide layer is masked by selectively forming an etchant-resistant material on the layer. Subsequently, a gas etchant is used to isotropically etch the tin oxide layer such that substantially all of the exposed tin oxide is cleanly removed. The gas etchant of the invention, because of its isotropic etching property, removes deposited tin oxide material from sidewalls and further slightly undercuts masked tin oxide portions in order to remove tin oxide shorts between patterned tin oxide structures. Preferably, the gas etchant of the invention includes a major proportion of an inert gas, such as nitrogen, and a minor proportion of hydrogen iodide gas. The tin oxide etch is performed at a temperature ranging from about 144° C. to about 450° C.

Another embodiment of the invention includes apparatus for selectively etching a tin oxide layer on a semiconductor wafer. The apparatus comprises a vessel having an interior for holding at least one semiconductor wafer to be etched. A source of hydrogen iodide gas and a source of an inert gas are coupled to a mixer, which in turn is coupled to the interior of the vessel, preferably at the top, to form an inlet therein. The apparatus further includes a temperature controller for regulating the temperature of the interior to between 144° C. and about 450° C., more preferably between about 200°–400° C.

In another embodiment of the invention, the apparatus includes an ionizer, such as an RF cathode, in order to turn the hydrogen iodide and the inert gas into plasma. The plasma etch apparatus further has an evacuator coupled to the vessel such that a hydrogen iodide plasma etch can occur at pressures ranging from 0.1 to 1.0 torr.

BRIEF DESCRIPTION OF THE DRAWINGS

The invention and its advantages will be more clearly understood by referring to the following detailed description in conjunction with the drawings, wherein.

DETAILED DESCRIPTION OF ILLUSTRATED EMBODIMENTS

Figure 1A:
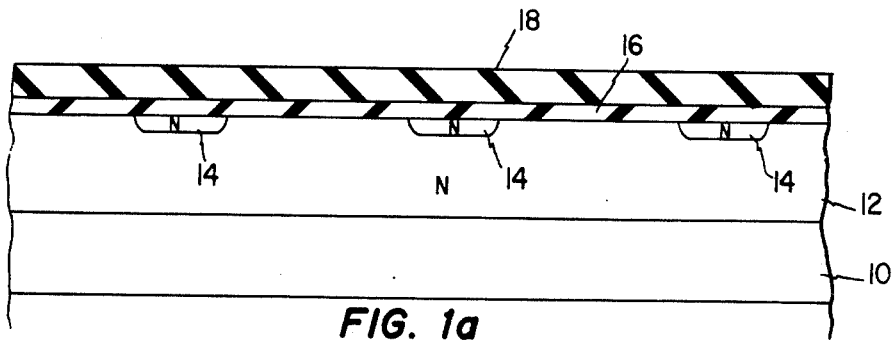
FIGS. 1a–1c are schematic cross sections of a semiconductor substrate, illustrating successive stages in a process according to the invention for etching tin oxide electrodes of a CCD imager.
Figure 1B:
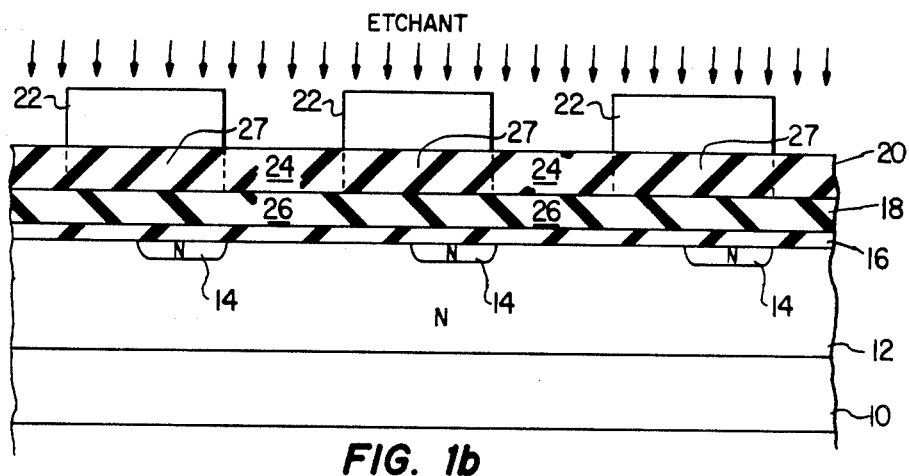
Figure 1C:
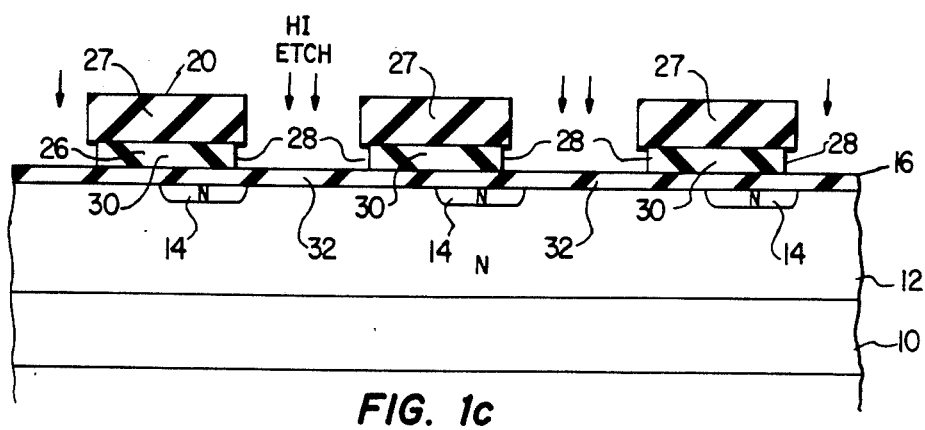

Turning now to FIGS. 1a–1c, successive steps in a tin oxide etching process according to the invention are schematically illustrated. The illustrated cross sections are of a CCD imager in successive stages of fabrication. In FIG. 1a, a semiconductor substrate 10 has been implanted, as with phosphorus, to create an N-type buried channel 12. The buried channel is uniformly implanted over the entire active device area. Before this step, a plurality of elongate channel stop regions, located parallel to but out of the plane of the section shown, were implanted into semiconductor substrate 10 in order to form a plurality of semiconductive channels between them. FIGS. 1a–1c are sections of one such channel.

Next, an oxide layer (not shown) is grown and the layer is patterned with a first well photomask (not shown). The oxide exposed by this photomask is etched and then a very shallow arsenic layer 14 is implanted into the exposed silicon. Implanted regions 14 will later form clocked wells of the CCD imager.

The oxide is thereafter stripped and a clean gate oxide 16 is regrown to uniformly cover substrate 10. Then, a uniform layer 18 of tin oxide is deposited across the entire device. The thickness of tin oxide layer 18 is preferably about 2000 angstroms thick, but can vary between about 1500 and about 3000 angstroms.

Turning now to FIG. 1b, a layer 20 of oxide is deposited over tin oxide layer 18. Layer 20 can be comprised of any of several different etch-resistant materials, such as polysilicon, silicon nitride, alumina, or silicon dioxide, or combinations of these. Silicon dioxide is a particularly preferred composition. Oxide layer 20 can range from a few hundreds to thousands of angstroms thick, a preferred thickness thereof ranging from 1500 to 2000 angstroms.

Next, a layer 22 of photoresist is deposited on oxide layer 20 and patterned. An oxide-selective conventional etchant is then applied in order to remove regions 24 of oxide 20. An oxide etchant that has been found to be particularly effective is an aqueous solution of one part hydrogen peroxide to five parts hydrofluoric acid to fifty parts water. Alternatively, a dry plasma etch can be used to remove areas 24, the etchant gas preferably consisting of tetrafluoromethane with a small percentage of oxygen.

This etch exposes regions 26 of tin oxide layer 18. A patterned oxide mask, comprising regions 27, is thus provided for tin oxide layer 18.

Turning now to FIG. 1c, a tin oxide etching step of the process of the invention is illustrated. In this step, a gas etchant is used that attacks the exposed tin oxide regions 24, while causing little or no etching of either oxide mask 20 or gate oxide 16. In a first embodiment, the gas etchant used is hydrogen iodide entrained into an inert gas such as nitrogen at a molar ratio of approximately $6.7 \times 10^{-4}$. Other inert gases, such as argon, can be employed in the place of nitrogen. In this embodiment, the etch is preferably performed at about atmospheric pressure. The etching reaction using the preferred etchant proceeds as follows:

$$SnO_2 + 4HI \rightarrow SnI_4 + 2H_2O$$

For satisfactory operation, it is necessary to perform the reaction at an elevated temperature in order to form volatile components of the etched substance that can be carried away by the etchant gas. Therefore, the lowest temperature at which this gaseous etch will work is defined by the melting point of $SnI_4$ which is 144.5° C. The highest possible temperature under which this etch can be performed is 450° C., above which the HI in the preferred $HI + N_2$ mixture begins to decompose into iodine and hydrogen vapor. The optimum temperature that gives the best results is approximately 300° C., but this temperature is not critical. Similar results are obtained at 200° C. and 400° C. The etch as performed under the above-described conditions is very selective, as it attacks the oxide mask to such a minor degree that it cannot be measured.

The results of the preferred etch step are shown in FIG. 1c. Under the disclosed temperatures and pressure, the HI etch of the invention acts isotropically, that is without having any preferred etch direction. Therefore, the etchant will cause an undercut 28 so that the remaining oxide mask regions 27 overhang the etched tin oxide layer 26 by a small amount. This etch operates to very cleanly define a plurality of tin oxide electrodes 30. Regions 27 of the oxide mask are left in place in the final CCD imager array, with contacts to tin oxide electrodes 30 taking place outside of the plane of the section shown in FIG. 1c.

The remaining steps in synthesizing a CCD imager array may be quickly summarized. After the hydrogen iodide etch is completed, a virtual well implant is performed and after than an additional threshold phosphorus implant (not shown) is done. Then, a boron implant (not shown) is performed over the surface of areas 32, which become the virtual phase areas of the CCD imager. This boron implant is connected to the P-type channel stops of the array. After this final implant, a passivating oxide overcoat is deposited over the entire structure, and a final anneal step is done to remove damage caused by the various implants.

While the fabrication of a tin oxide virtual phase CCD imager has been described in particular, other CCD images of more complex topography can be likewise fabricated, such as multiphase CCD imagers. As shown below, the isotropic nature of the etchant of the invention is particularly advantageous in obtaining high quality etches of tin oxide structures on complex topographics.

The undercutting phenomenon shown at 28 in FIG. 1c is particularly advantageous where a plurality of tin oxide structures are designed to cross over another undercut structure, such as a polysilicon electrode.

Figure 2:
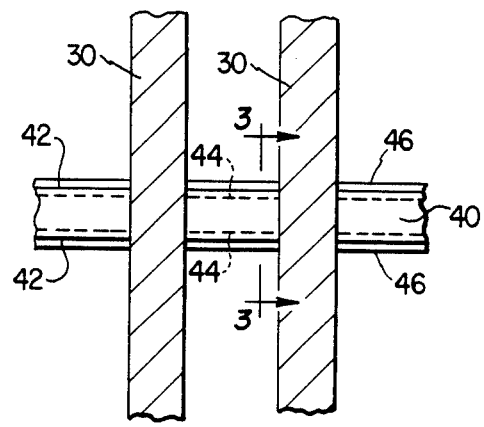
FIG. 2 is a schematic plan view of a prior art contact area of a CCD imager, showing the crossing of tin oxide electrodes over a polysilicon electrode.

FIG. 2 is a schematic plan view of a small portion of a tin oxide contact area according to the prior art. The area shown is an area for contacting conductive tin oxide electrodes to other conductors such as aluminum. This area is peripheral to the CCD imaging array itself. FIG. 2 illustrates a disadvantage in using prior art, anisotropic etchants. Two tin oxide electrodes 30 are patterned and etched to cross over a polysilicon electrode 40. (Intervening layers of oxide are not shown.) Poly electrode 40 is an undercut structure, and overhangs a lower oxide layer in elongated regions 42.

Figure 3:
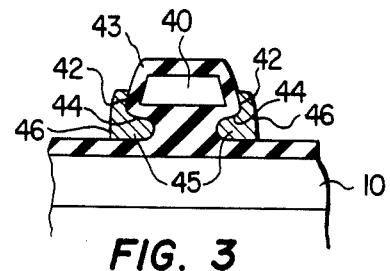
FIG. 3 is a schematic cross section taken along lines 3—3 of FIG. 2.

FIG. 3 is a cross section taken along lines 3—3 of FIG. 2, and illustrates the structure obtained when an anisotropic etch is used in attempting to define electrodes 30. An oxide layer 43 has been formed from substrate 10 and electrode 30, to form overhanging regions 42 and open channels 44. A layer of tin oxide is deposited over the area. Then a conventional etchant is used to remove the tin oxide in all but desired areas, such as electrodes 30. One or more tin oxide shorts 45 are left over after the anisotropic etch is completed. Shorts 45 extend inward to fill channels 44, and have further portions 46 that are adjacent the sidewalls formed by layer 43. This structure results because conventional etchants etch only in a downward direction. A large of a certain thickness is removed from all areas, and portions 46 are left where this vertical thickness is exceeded. Shorts 45 electrically connect electrodes 30 (FIG. 2) to short them together.

It has been discovered that the preferred etchant of the invention alleviates this problem. In the structure shown in FIGS. 2 and 3, shorts 45 are eliminated because of the tendency of the preferred etchant to undercut any masking or superimposed layer. The etchant of the invention is therefore useful in clearly defining tin oxide structures in areas of complex surface topography.

Figure 4:
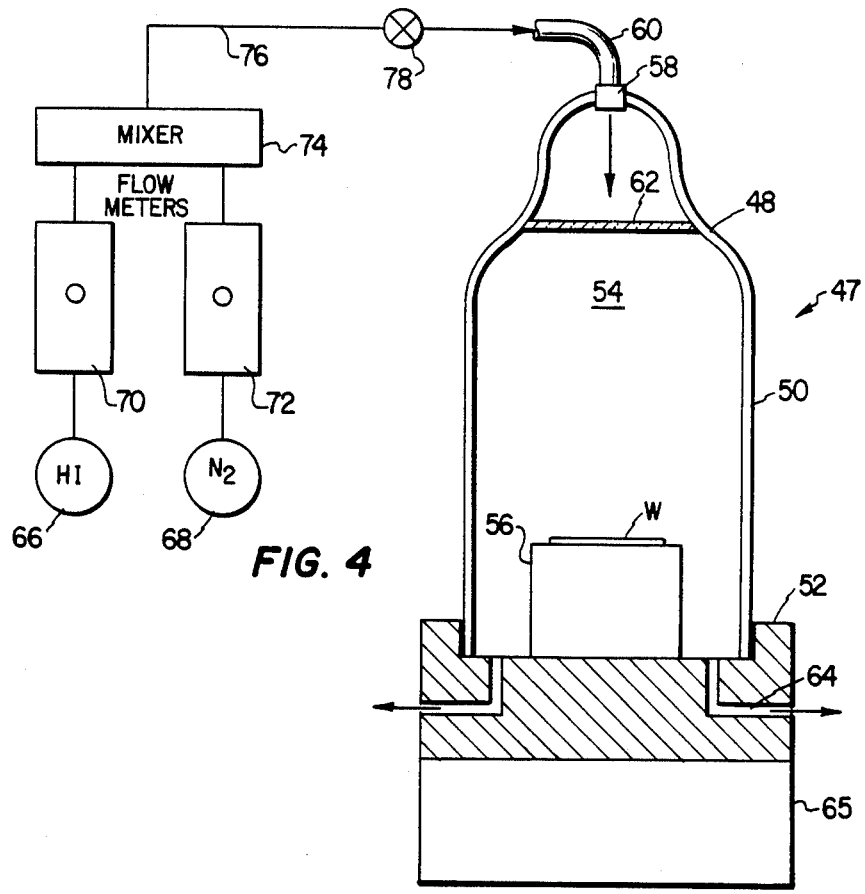
FIG. 4 is a part-schematic, part-sectional view of a dry etch reactor according to the invention.

Turning now to FIG. 4, a preferred apparatus for effecting the inert gas/hydrogen iodide atmospheric etch of the invention is indicated generally at 47.

It has been found that an arrangement of wafers in a horizontal reactor with a gas source at one end produces a differential amount of etching, with wafers closer to the gas etchant source being more etched than wafers further away from the source. Accordingly, a vertical wall reactor 48 has been developed and is preferred. Reactor 48 has a glass of quartz cylindrical wall 50. Wall 50 is sealably joined to a base 52, which is preferably an aluminum block. Since the aluminum block automatically forms a layer of $Al_2O_3$ and the wall 50 is of $SiO_2$, the chamber interior has a completely passivated surface immune from attack by the HI etchant. Wall 50 and base 52 together define a chamber 54 that in the illustrated embodiment is approximately one liter in volume. A stand or platform 56, of aluminum or other refractory material, is provided to support a wafer that has had deposited on it a layer of tin oxide and a patterned and etched oxide mask.

An inlet 58 is sealably joined to the top of chamber 54. Inlet 58 is connected to a sheath or tube 60 that is in turn connected to a gas etchant supply described below.

In a preferred embodiment, a disperser, such as a glass frit disperser 62, is disposed across inlet 58 in order to provide better gas flow uniformity.

Aluminum block 52 has a plurality of radially disposed channels 64 for the exhaust of the etchant gas. The gas may be collected into a manifold (not shown) or simply exhausted under a hood to appropriate disposal apparatus. Because of the low HI concentrations used in the etchant gas, the toxicity of the exhaust gas does not represent a major problem and can be handled by conventional scrubbers.

The remainder of apparatus 47 is more schematically described. Sources 66 and 68 provide hydrogen iodide and nitrogen gas, respectively. Hydrogen iodide gas source 66 is connected to a flow meter 70 which can be set in order to obtain the preferred volumetric flow of the gas. Likewise, a flow meter 72 is provided that is connected to nitrogen source 68. Flow meters 70 and 72 are in turn connected to a mixer 74 so that the hydrogen iodide may be properly entrained into the nitrogen gas. In the illustrated embodiment, the preferred composition of gas etchant is created if approximately 30 liters per minute of nitrogen gas is mixed with approximately 20 cubic centimeters per minute of hydrogen iodide at approximately the same pressure. This creates an HI molar concentration of approximately $6.7 \times 10^{-4}$, and a flow rate (30 l/minute/1) sufficient to carry away the etchant reaction products. Where the volume of the reactor chamber is approximately one liter, a flow rate of about 30 l/minute is sufficient. Where the volume of the reactor is greater or smaller, the flow rate should be adjusted proportionately. The resultant gas etchant mixture is piped through a tube or pipe 76 through one or more conventional valves or other regulating apparatus represented schematically at 78, and into inlet tube 60. While the illustrated reactor 48 is sized to take only one wafer at a time, reactor 48 can be easily modified for high volume production since no vacuum is used. Reactor 48 is heated by means of a hot plate 65 or other heating apparatus, and is controlled by a thermostat (not shown) to heat the interior 54 to a selected temperature in the range of 144.5° C. to 450° C.

In an alternate embodiment, a plasma etch reactor is used in connection with the gas etchant mixture provided by the invention. In this embodiment, a radial flow reactor is used, such as the one shown in U.S. Pat. No. 3,757,733 issued to A. Reinberg, herein incorporated by reference. In this alternate embodiment, a plasma etch using nitrogen entrained with hydrogen iodide is performed at a pressure ranging from 0.1 to 1 torr. In the plasma etch reactor, all surfaces contacted by the ionized hydrogen iodide must be passivated, or must be constructed of or faced with a relatively impervious material such as silicon dioxide or aluminum (which automatically develops an aluminum oxide coating). The plasma etch reactor includes an ionizing electrode disposed above the wafers to be etched, and an RF source electrically connected thereto, for creating the plasma from the HI. A pump or other appropriate evacuating means is used to keep the reaction chamber at the indicated low pressure.

EXAMPLE

A CCD imager array was fabricated using the apparatus illustrated in FIG. 4. A silicon dioxide mask was deposited on a tin oxide sheet to a thickness of between 1500 and 2000 angstroms and patterned and etched to provide a mask. The wafer was subjected to a hydrogen iodide etch using the following parameters. A gas flow of nitrogen approximately 30 liters per minute and a gas flow of hydrogen iodide approximating 20 cubic centimeters per minute were introduced into the described vertical reactor, which had a volume of about one liter. The temperature was regulated to about 300° C. An etch rate of approximately 2000 angstroms for every three minutes was observed. The attack on the oxide mask was very small, and was not significant in comparison to the tin oxide etch rate. No tin oxide shorts resulted, and a CCD imaging apparatus of very high quality was produced.

In summary, a method and apparatus for isotropically etching tin oxide with a gas etchant has been disclosed and described. In a preferred embodiment, hydrogen iodide is used to give a high-resolution, uniform etch without the presence of tin oxide shorts. The etching of the invention has a very high differential rate of etch of tin oxide in relation to silicon dioxide and is capable of producing CCD imagers of high quality and resolution.

ADVANTAGES OF THE INVENTION

A principal advantage of the invention is the provision of a gas etchant that isotropically etches tin oxide. Another advantage of the etchant of the invention is that it is capable of etching away tin oxide shorts occurring underneath overhung structures, on sidewalls of vertical structures, and in other complex surface topographies. A further advantage is the provision of a gas etchant which selectively etches tin oxide without materially affecting a silicon dioxide masking layer or gate insulator. Another advantage is the provision of an etchant which will produce a very high resolution etch that can be used in the fabrication of high-quality CCD imagers. A further advantage of the invention is that the etchant provided has a low toxicity. Another advantage is the provision of an etchant that can be used under both atmospheric and plasma etch conditions. Yet another advantage of the invention concerns the provision of a vertical wall reactor for providing a uniform etch rate. Another advantage is provided for by a glass frit disperser in order to get a more uniform flow rate of the gas etchant inside the reactor of the invention. A further advantage of the invention is the provision of an etch process that can be carried out at a relatively wide range of temperatures.

What is claimed is:

1. A method for etching a tin oxide layer deposited on a surface, comprising the steps of:
    masking the tin oxide layer by selectively forming an etchant-resistant material thereon; and
    isotropically etching the tin oxide layer with a gas etchant, such that substantially all of the exposed tin oxide is removed.

2. The method of claim 1, and further including the step of:
    forming the gas etchant from a major portion of an inert gas and a minor portion of hydrogen iodide.

3. The method of claim 2, wherein the molar ratio of hydrogen iodide gas to the inert gas is about $6.7 \times 10^{-4}$.

4. The method of claim 3, wherein the inert gas is nitrogen.

5. The method of claim 2, and further comprising the steps of:
    ionizing the gas etchant to create an etchant plasma; and
    subjecting the tin oxide layer to the etchant plasma at a preselected pressure ranging between 0.1 and 1 torr.

6. The method of claim 1, wherein the etchant-resistant material is selected from silicon nitride, polysilicon, alumina, or silicon dioxide.

7. The method of claim 6, wherein the etchant-resistant material is silicon dioxide.

8. The method of claim 1, and further including the step of etching the tin oxide with the gas etchant at substantially atmospheric pressure and a temperature ranging from 144.5° C. to about 450° C.

9. The method of claim 8, wherein the temperature ranges from about 200° C. to about 400° C.

10. A method for forming a tin oxide structure on a surface of a semiconductor chip, comprising the steps of:
 depositing a tin oxide layer on the surface;
 depositing a hydrogen iodide-resistant layer on the tin oxide layer;
 patterning and etching the hydrogen iodide-resistant layer to form a mask for the tin oxide layer; and
 etching the tin oxide layer with a gas etchant having an active component comprising hydrogen iodide.

11. The method of claim 10, wherein the hydrogen iodide-resistant layer comprises a material selected from the group consisting of silicon nitride, polysilicon, alumina, silicon dioxide, and combinations thereof.

12. The method of claim 11, wherein the hydrogen iodide-resistant layer comprises silicon dioxide.

13. The method of claim 10, and further including the steps of:
 forming a member on the surface with substantially vertical sidewalls prior to depositing the tin oxide layer;
 depositing the tin oxide layer on the surface such that said layer covers the sidewalls;
 masking the tin oxide layer to expose unmasked areas thereof; and
 isotropically etching the tin oxide layer with the gas etchant to remove the tin oxide from the sidewalls in the exposed areas.

14. The method of claim 10, and further including the steps of:
 forming a member on the surface prior to depositing the tin oxide layer;
 undercutting the member to form at least one undercut region adjacent a lower portion of the member disposed between an upper portion thereof and the surface; and
 depositing the tin oxide layer on the surface and on the member such that the tin oxide at least partly occupies the undercut region;
 masking the tin oxide layer to expose unmasked areas thereof; and
 isotropically etching the tin oxide layer with the gas etchant to remove the tin oxide in the undercut region in the unmasked areas.

15. The method of claim 10, and further including the step of etching the tin oxide layer at a rate of about 2,000 angstroms in three minutes.

16. The method of claim 10, and further including the steps of:
 disposing the surface in an etching chamber after the step of patterning and etching the hydrogen iodide-resistant layer;
 forming the gas etchant from a major portion of inert gas and a minor portion of hydrogen iodide, and
 flowing the gas etchant through an etching chamber at a rate of about 30 liters per minute per liter.

17. The method of claim 16, and further including the step of mixing the hydrogen iodide and the inert gas in a molar ratio of about $6.7 \times 10^{-4}$.

18. The method of claim 16, and further including the step of flowing the gas etchant into the etching chamber at approximately atmospheric pressure.

19. A composition for etching tin oxide, comprising:
 a minor proportion of hydrogen iodide gas; and
 a major proportion of an inert gas.

20. The composition of claim 19, wherein said inert gas comprises nitrogen.

21. The composition of claim 20, wherein said minor proportion and said major proportion are mixed in a molar ratio of about $6.7 \times 10^{-4}$.

22. Apparatus for selectively etching a tin oxide layer on a semiconductor wafer, comprising:
 a vessel having an interior for holding at least one semiconductor wafer to be etched;
 a source of hydrogen iodide gas;
 a source of an inert gas;
 a mixer for mixing said hydrogen iodide gas and said inert gas to form a gas etchant;
 means for flowing the gas etchant from the mixer into the interior; and
 a temperature controller for regulating the temperature of the interior to between about 144° C. and about 450° C., such that the tin oxide layer is isotropically etched.

23. The apparatus of claim 21, wherein said vessel has a top portion, said means for flowing the gas etchant into the interior comprising an inlet disposed in said top portion.

24. The apparatus of claim 21, wherein said means for flowing the gas etchant into the interior includes an inlet communicating through said vessel into said interior, a disperser for dispersing said gas etchant disposed across said inlet.

25. The apparatus of claim 23, wherein said disperser comprises a ceramic frit disperser.

26. The apparatus of claim 21, and further comprising:
 an ionizer disposed within said vessel for creating an etchant plasma from said gas etchant; and
 an evacuator coupled to said vessel for maintaining a pressure in said vessel selected from a range of about 0.1 to about 1 torr.

* * * * *